United States Patent
Kelly et al.

(10) Patent No.: US 6,524,663 B1
(45) Date of Patent: Feb. 25, 2003

(54) METHOD FOR SELECTIVE ACTIVATION AND METALLIZATION OF MATERIALS

(75) Inventors: Patrick V. Kelly, Cork (IE); Gabriel M. Crean, Carrigaline (IE); Daniel J. Macauley, Letterkenny (IE)

(73) Assignee: University College Cork-National University of Ireland, Cork (IE)

( * ) Notice: Subject to any disclaimer, the term of this patent is extended or adjusted under 35 U.S.C. 154(b) by 0 days.

(21) Appl. No.: 09/333,325

(22) Filed: Jun. 15, 1999

(30) Foreign Application Priority Data

Jun. 15, 1998 (IE) .................................................. 980461

(51) Int. Cl.$^7$ ............................. B05D 1/32; B05D 3/06; B05D 5/04; B05D 5/12
(52) U.S. Cl. ....................... 427/553; 427/125; 427/304; 427/305; 427/259; 427/282; 427/229; 427/98; 427/437; 427/443.1
(58) Field of Search ................................ 427/553, 125, 427/304, 305, 259, 282, 229, 98, 443.1, 437

(56) References Cited

U.S. PATENT DOCUMENTS

| | | | | |
|---|---|---|---|---|
| 4,830,714 A | * | 5/1989 | Sirinyan et al. ............... | 204/24 |
| 4,900,581 A | | 2/1990 | Stuke et al. | |
| 4,990,363 A | * | 2/1991 | Suhr et al. ..................... | 427/40 |
| 5,032,488 A | * | 7/1991 | Finter .......................... | 430/270 |
| 5,100,693 A | * | 3/1992 | Eisch et al. ................. | 427/54.1 |
| 5,130,172 A | * | 7/1992 | Hicks et al. ................. | 427/252 |
| 5,139,818 A | * | 8/1992 | Mance ........................ | 427/54.1 |
| 5,281,447 A | * | 1/1994 | Brady et al. ................. | 427/555 |
| 5,534,312 A | * | 7/1996 | Hill et al. ................... | 427/553 |

FOREIGN PATENT DOCUMENTS

| | | |
|---|---|---|
| EP | 243794 | 11/1987 |
| EP | 483782 | 5/1992 |

OTHER PUBLICATIONS

European Search Report for European Application EP 99 65 0050.

Hirama, Y., et al., "Electroless Plating Formation of Conductive Circuit Pattern," Chemical Abstracts, (1991) 114(26)Abstract #258029.

Ogiwara, Y., et al., "Manufacture of Metal–Coated Optical Fibers," Chemical Abstracts (1994) 121(18) Abstract#211289.

Esrom et al. "UV Light–Induced Deposition of Copper FIlms", Journal de Physique Colloque C5, Supplement au No. 5, Tome 50, May 1989.

Esrom et al. "VUV Light–Induced Deposition of Palladium Using an Incoherent $Xe_2$ Excimer Source", Chemtronics 4 (1989) pp. 202–208.

Esrom et al. "Modification of Surfaces with New Excimer UV Sources", Applied Surface Science vol. 54 (1992) pp. 440–444.

Esrom and Kogelschatz, "Metal Deposition with a Windowless VUV Excimer Source" Thin Solid Films (Switzerland) vol. 218 Nos. 1–2 (1992) pp 231–246.

* cited by examiner

*Primary Examiner*—Shrive P. Beck
*Assistant Examiner*—Jennifer Kolb Michener
(74) *Attorney, Agent, or Firm*—Morrison & Foerster LLP

(57) ABSTRACT

An activated substrate surface suitable for electronics and microsystems preparation is prepare by contacting the surface with a surface activation compound, e.g. organometallic based on palladium, platinum, rhodium or iridium. The photo labile ligand has an optical absorption band which overlaps with the wavelength of the UV. A UV lamp is used, in combination with a mask, to selectively irradiate the contacted surface. Irradiation of the surface with light of a suitable wavelength decomposes the organometallic compound to the activating metal. The surface is then ready for electroless plating with the desired conducting material. The mask is patterned to delineate areas where surface activation is not to occur. The organometallic compound absorbs ultraviolet radiation in the wavelength range 210–260 nm, or in the wavelength range 290–330 nm, in the solid state if the compound exists as a solid at 25° C. or in the liquid state if the compound exists as a liquid at 25° C.

20 Claims, No Drawings

METHOD FOR SELECTIVE ACTIVATION AND METALLIZATION OF MATERIALS

FIELD OF THE INVENTION

The present invention relates to metallisation of materials, which may be electrically insulating, electrically semiconducting, or electrically conducting and relates in particular to electroless plating, and more particularly to a method for producing a patterned surface activation film on a substrate for receiving a layer of conducting material in a subsequent electroless plating step, and the use of organometallic compounds for surface activation in the metallisation of materials.

BACKGROUND ART

High specification metallisation of materials, especially electrically insulating and semiconductor materials, is increasingly required in modern electronics and microsystems. A variety of techniques are used in industrial processes, but all have limitations. Electroplating cannot be used on an insulating substrate unless an electrically conducting coating is applied to it. Evaporation techniques require a high vacuum and high temperature and give poor resolution and waste a lot of metal, and are characterised by low volumes. Radio frequency (RF) sputtering requires a high vacuum, gives poor resolution, wastes a lot of metal and requires specialised equipment. Chemical vapour deposition employs toxic and flammable gases. Thick film screen printing is typically restricted to a minimum of 80 $\mu$m line and space widths. Laser or ion beam lithography is expensive, requires scanning to cover large areas, substrate and coating damage can result from localised heating, and in the case of ion beam lithography, a high vacuum is required.

Electroless plating has yielded good quality results, and has the advantage that it can be used to plate electrical insulators and electrical semiconductors as well as electrical conductors, but is expensive because it involves a large number of steps. In particular, electroless plating selectively on some parts of a substrate only involves preparing a patterned surface activation film on the substrate to initiate the subsequent electroless reaction. The current technique for producing a patterned surface activation film on an substrate for receiving a layer of conducting material in a subsequent electroless plating step comprises the steps of:

a) preparing a solution of the film compound;
b) forming a coating of the solution on the insulating substrate and allowing the solvent to evaporate so as to leave a film of the compound;
c) covering the film with a patterned mask;
d) irradiating the film through the patterned mask under vacuum conditions;
e) rinsing the film whereby the non-irradiated parts are removed, leaving a patterned film.

U.S. Pat. No. 4,900,581 to Stuke et al. dated Feb. 13, 1990 identifies two disadvantages of the current technique, namely that the irradiation step which uses a scanning argon laser is slow and that the irradiation step does not yield sharp edges. Stuke proposes the use of sheet wise irradiation predominantly in the ultra-violet spectral range, greatly speeding up the irradiation step and also improving the sharpness of the edges. Both in the prior art acknowledged by Stuke and in the teaching of Stuke, use is made of palladium acetate as the compound of the surface activation film. The Stuke patent claims embrace metal acetates, metal acetylacetonates and metal formiates.

Further work by Esrom et al., (some of whom are co-inventors with Stuke) published in Journal de Physique Colloque C5, Supplement au No. 5, Tome 50, 5/1989, indicates that, in the case of palladium acetate, the compound mentioned in Stuke, the ultraviolet wavelengths used are in a wavelength range shorter than 190 nm, in which wavelength range light is strongly absorbed by quartz and other common optical glasses, as well as by air. In addition, Esrom states that the optimum processing conditions use a concentration of $0.47 \times 10^{-3}$ M palladium acetate solution, in trichloromethane (chloroform) to produce a dip coated film of 750 Å thickness. This film is then photolysed by placing the coating and substrate material under vacuum, and by exposing the coating to ultraviolet light from an excimer discharge lamp in narrow wavelength range about 172 nm at an unspecified optical intensity for 3–30 minutes, resulting in the production of a 50 Å maximum thickness film of palladium at saturation fluences. The surface roughness of the alumina substrates used in that work is not published.

Further work by Esrom et al., published in Chemtronics 4 (1989) pages 202–208 "VUV light-induced deposition of palladium using an incoherent $Xe_2^*$ excimer source" indicates that, in the case of palladium acetate, using ultraviolet radiation at a wavelength of 172 nm from a silent discharge excimer lamp source in a vacuum chamber containing the sample, the rate of decomposition is enhanced dramatically when the exposure is performed at a pressure of approximately 1 torr. Esrom et al. in this paper explain this effect as enhancement of the removal of the volatile reaction products from the palladium acetate coating, without presenting experimental evidence of this. Esrom states in this work that "patterning was achieved by using metal contact masks". As metals are opaque to ultraviolet and visible radiation, it is believed that these masks must have had physical apertures made in them at the sites to be irradiated.

Further work by Esrom et al., published in Applied Surface Science Vol. 54 (1992) pages 440–444 "Metal Deposition with a windowless VUV excimer source" has demonstrated the process using irradiation in the wavelength ranges 126±12 nm, and 146±12 nm.

Additionally, a review paper by Esrom and Kogelschatz published in Thin Solid Films (Switzerland) vol. 218 nos. 1–2 (1992) pp 231–246 "Surface Modification with Excimer UV Sources", demonstrates the process with palladium acetate using incoherent excimer lamp radiation at 222 nm wavelength.

A palladium acetate based selective activation process has been developed by the Technische Universität Berlin in collaboration with the Fraunhofer Gesellschaft Institut für Zuverlassigkeit und Mikrointegration, Berlin. The process is based on the incorporation of palladium acetate within a photopolymerisable (wavelength 366 nm) precursor layer. This coating is selectively exposed, and the unexposed material is rinsed off. The exposed areas form a so-called palladium (II) network, consisting of a palladium acetate impregnated selective polymer coating. The palladium acetate is then reduced by a wet chemical immersion to palladium metal, and electroless plating is performed. The UV exposure does not reduce the palladium (II) acetate to palladium, buy merely links it into a polymer.

Palladium acetate is a metallic salt. It is not an organometallic compound, in which a metal atom is linked directly to one or more carbon atoms.

Specific difficulties with the Stuke process are:

That the process does not produce the required activation at atmospheric pressure or with a monolithic deep-ultraviolet-transmitting quartz or fused silica plate in contact with the coated substrate unless the workpiece is at a minimum temperature and is exposed to a minimum ultraviolet intensity, thereby precluding its practical use with a monolithic aperture-free mask of the type commonly used in photolithography processes and mask aligners, consisting of a transmitting plate of quartz or fused silica with a selective metal coating at the sites on the coating which are not to be exposed to ultraviolet radiation.

The practical limitation of the use of excimer lamp sources to those practically realisable excimer lamps in the air-transmissible ultraviolet (only those centred at 222 nm and 308 nm, which are based on inert gas chloride excited dimer complexes), which practically limits photochemistry with these sources to compounds having a photosensitivity in wavelength ranges close to these centres.

The limitation of the process to the use of metallic salts whose photoactivity has not been optimised for the narrow wavelength range of intense ultraviolet emission from practically realisable excimer lamps in the air-transmissible ultraviolet (those centred at 222 nm and 308 nm) and which do not contain functional groups which are photolabile in the solid state of the compound close to these peak emission wavelengths of these practically useful excimer lamps.

It has also been found:

that the method produces a selective decomposition of the palladium acetate even when a glass filter opaque to the ultraviolet radiation wavelength is interposed between the operating excimer lamp ultraviolet source and the chemically coated substrate, provided that the glass filter does not contact or closely approach the coated substrate.

When an excimer lamp is supplied with the required radio-frequency high voltage power, and the chamber pressure is reduced to approximately 1 torr, a plasma fills the chamber, whether or not the lamp discharge is struck to induce it to start emitting ultraviolet radiation.

The process exhibits its reported low pressure enhancement of the decomposition reaction rate only in the pressure range (approximately 10–0.01 torr) over which a plasma associated with the excimer lamp source exists in the chamber with significant low intensity (compared to the excimer lamp) optical emission at wavelengths in the range 300–500 nm, and that the process of Stuke ceases to exhibit the reported enhancement of the decomposition reaction rate if the pressure is reduced to approximately 0.001 torr or lower.

The present invention is based on a most unexpected discovery that certain compounds, known per se, but not previously used in forming a surface activation film prior to electroless plating, are not only suitable for producing a selective activation for electroless plating, but in addition allow the production of that surface activation using a mask consisting of a glass plate coated with a patterned metal coating and on the further discovery that, in certain circumstances, the irradiation may be carried out without the need to use a vacuum. The optical absorption properties of these compounds in the solid state, previously unreported, and their thermal decomposition temperatures, previously unreported, make them most suitable for selective photodecomposition under atmospheric pressure conditions, provided that they are maintained during irradiation within a specified temperature range, and are exposed to at least a specified fluence of ultraviolet radiation whose wavelength is within a specified range, for a specified time duration. Specifically, these compounds consist of an organometallic compound, as described previously wherein the bonding between the metal and the respective carbon or organic group in the active ligand is achieved by a predominantly covalent arrangement resulting in a metal to ligand bond. The metal is one suitable for the catalysis of electroless deposition (generally a hydrogenation-dehydrogenation metal catalyst such as palladium or platinum). The chemical molecular structure contains a photolabile functional group as a ligand to the metal, such that the compound possesses an optical absorption band arising due to ligand-to-metal charge transfer, such that the said optical absorption band overlaps closely to the optical emission band of the excimer lamp type to be used in the ultraviolet exposure, when the chemical is in the pure solid or liquid state, at room temperature.

In the prior art, irradiation has been carried out using a wide variety of different wavelengths from 100 nm to 500 nm. The choice of wavelengths has depended to a large extent on the available equipment, with certain types of equipment at the lower wavelengths being less expensive and more readily available. Also, use of longer wavelengths, such that photo-decomposition does not occur, requires the radiation to be intense enough to induce local heating for thermal decomposition, which therefore gives poorer resolution. In all cases in which the wavelength is less than 190 nm, the method must be carried out under vacuum or a gas which does not absorb the wavelength of light used (i.e. which must at least be free of oxygen and water vapour). The present invention is based on the appreciation that use of wavelengths longer than 190 nm, the threshold for absorption by air and by quartz glass, would in principle allow the process to be carried out without a vacuum, that at this relatively long wavelength the requisite resolution can be obtained only by photolysis, and even using photolysis the wavelength used must be as short as possible, so as to employ a photochemical insensitive to the wavelengths longer that 320 nm typically present in the natural daylight in a working area enclosed by common borosilicate glass windows.

SUMMARY OF THE INVENTION

In a first aspect, the invention provides a method of producing a surface activation of a substrate for receiving a layer of conducting material in a subsequent electroless plating step comprising:

a) forming a deposit or coating of a surface activation compound on the substrate, the surface activation compound being a compound of a metal which has the property of activating a surface for electroless plating of the desired conducting material; and b) irradiating the surface activation compound with ultraviolet radiation to produce a surface activation;

wherein
the surface activation compound is a compound which contains a photolabile group as a ligand to the metal, the metal being bonded to one or more carbon atoms of the ligand, and wherein the compound has the property of being photochemically active such that it decomposes to the metal when exposed to ultraviolet radiation of an appropriate wavelength and when at a certain temperature, but does not decompose at that temperature in the absence of ultraviolet radiation.

The ultraviolet radiation is suitably at a wavelength of or about 210 nm. It may also suitably be in a range up to 330 mm.

The irradiation step is preferably performed at a temperature which is below the temperature at which the surface activation compound coating starts to thermally decompose in the absence of ultraviolet radiation, but is above the temperature at which it will decompose in the presence of ultraviolet radiation at part or all of the wavelength range 210–260 nm or 290–330 nm such that decomposition is caused only at those sites on the heated substrate at which ultraviolet radiation falls on the surface activation compound.

In another aspect the invention provides a method of producing a surface activation of a substrate for receiving a layer of conducting material in a subsequent electroless plating step comprising:

(a) forming a deposit or coating of a surface activation compound on the substrate; and (b) irradiating the surface activation compound with ultraviolet radiation to produce a surface activation;

(c) the surface activation compound is a compound of a metal which has the property of activating a surface for electroless plating of the desired conducting material;

characterised in that:

(d) the surface activation compound is a compound of a metal in which the metal is bonded to either one or more carbon atoms and/or is bonded to chemical bond between one or more carbon atoms, such that the compound has the property of absorbing ultraviolet radiation in the wavelength range 210–235 nm or 290–330 nm such that it undergoes decomposition when exposed to one or more wavelengths of ultraviolet radiation from these specified wavelength ranges;

(e) the surface activation compound has the property of being photochemically active such that it decomposes to the metal which initiates the electroless plating step in the presence of ultraviolet radiation of an appropriate wavelength and when at a certain temperature, but does not decompose at that temperature in the absence of ultraviolet radiation;

(f) the irradiation step employs radiation in part or all of the wavelength range 210–235 nm or 290–330 nm; the radiation being transmitted through a gas and through a plate transparent to these wavelengths, in contact with the coating;

(g) the irradiation step is performed at a temperature which is below the temperature at which the activation compound coating starts to thermally decompose in the dark, but is above the temperature at which it will decompose in the presence of ultraviolet radiation at part or all of the wavelength range 210–235 nm or 290–330 nm, such that decomposition is caused only at those sites on the heated substrate at which ultraviolet radiation falls on the surface activation compound.

The irradiation step preferably employs radiation in part or all of the wavelength range 210–260 nm or 290–330 nm, more preferably in the sub-range 210–235 nm or 290–330 nm; the radiation being transmitted through a gas and through a mask or plate transparent to these wavelengths, in contact with the coating. By using such a mask it is possible to achieve better line resolution than would otherwise be achievable.

The gas utilised may be selected from air, nitrogen or an inert gas such as helium, argon, krypton or xenon.

In the present invention the surface activation compound is a compound of a metal in which the metal is bonded to one or more carbon atoms of the ligand. As is well known for organometallics, the bonding in the ligand may be delocalised with the result that the hapticity (the number of atoms of the ligand with which the metal shares electrons) is greater than one. In this case, the bond is formed by the sharing of electrons between the metal and the ligand. If the ligand has a delocalised bonding structure (a $\pi$ bond) then the metal may be bonded to more than one carbon atom. In a formula drawing, this may be represented by showing the metal bonded to the chemical bond between two or more carbon atoms.

In true organometallic compounds, a predominantly covalent bond exists between the metal and an active ligand. The number of active ligands in the compound can vary, but at least one must be present. It is also possible to have additional ancilliary or spectator ligands which are not photochemically active. Spectator ligands can bond to the metal through any atom including carbon. The term active ligand is used herein to refer to a ligand which is bonded to the metal by a metal-carbon bond and is photolabile.

In the method of the present invention, the exposure of the compound to the ultraviolet radiation weakens the metal-carbon bond which allows subsequent cleaving or decomposition of the compound to the metal.

The surface activation compound may be applied to the substrate in the form of a liquid, a solution of a solid surface activation compound being prepared if required. A solid compound may be dissolved in tetrahydrofuran or other suitable solvents.

If a patterned activation is to be produced, the plate may have a thin opaque coating on the side which is to be in contact with the substrate which is patterned such as to mask the surface activation compound from exposure to the ultraviolet radiation at the sites which are not to be activated.

The surface activation compound has the property of absorbing ultraviolet radiation in the wavelength range 210–260 nm or 290–330 nm, in the solid state, if the compound exists as a solid at 25° C. or in the liquid state if the compound exists as a liquid at 25° C., normally at atmospheric pressure.

The plate may suitably be a quartz, silica or other plate which is transparent to ultraviolet radiation at 210–260 nm or 290–330 nm, and may be coated with chromium. The plate may be at least 2 mm thick.

The surface activation compound is an organometallic compound having an active ligand as described above. It will be appreciated that the organometallic compound can have one or more metal atoms present for example as in dimers such as bis compounds. In the case of a true dimer each metal atom will have an active ligand. Suitably the active ligand is an unsubstituted or substituted $C_1$–$C_{20}$ group such as a $C_1$–$C_{13}$ group optionally having one or more unsaturations (a $C_2$–$C_{20}$ preferably a $C_3$–$C_{13}$ alkenyl group). Preferred active ligands include those having one or more unsaturations such as unsubstituted or substituted allyl, or substituted or unsubstituted $C_2$–$C_{20}$ dienes more preferably $C_2$–$C_{13}$ dienes. The $C_2$–$C_{13}$ group may be straight-chained or branched or cyclic. A cyclic diene which is useful in the present invention is cyclooctadiene. Substitution is optional on the active ligand. Preferred substituents are $C_1$–$C_{10}$ alkyl groups including methyl and ethyl. One preferred active ligand is methallyl.

Spectator (non-active) ligands which may be present in organometallic compounds useful in the present invention include acetylacetonato and dibenzoylmethyl.

It will be appreciated that other spectator ligands and/or other atoms or groups of atoms could be bonded to the metal atom(s). For example if two metal atoms are present in the compound the metal atoms may be bridged one or more times such as by fluoro, chloro, iodo or bromo atoms.

The surface activation compound may be based on a metal of the platinum family such as platinum or palladium, or on iridium or rhodium.

Desirably, the surface activation compound is a compound in which the metal is π-bonded to the ligand.

Suitably, the metal is π-bonded to an optionally substituted lower alkenyl group in the ligand, the lower alkenyl group preferably having one or more olefinic double bonds and preferably having from 2 to 10 carbon atoms in a straight or branched chain or a carbocycle, particularly an allyl group.

Optionally, the lower alkenyl group may be substituted by an alkyl group having 1 to 10 carbon atoms and itself being optionally substituted by hydroxyl, $C_1$–$C_6$ alkoxy or di($C_1$–$C_6$ alkyl) amino group, particularly wherein the lower alkenyl group is methallyl group.

Suitably, the metal is selected from palladium and platinium.

Preferably, the metal compound is selected from a π-lower alkenyl-acetylacetonato metal (II) compound, a π-lower alkenyl dibenzoylmethyl-metal (II) compound, a bis (π-lower alkenyl-halo-metal (II)) compound, in which "halo" represents bromo, chloro, iodo or fluoro, or a cyclooctadiene metal (II) dihalide where "halide" represents chloride, bromide, iodide or fluoride.

Preferably the surface activation compound may be selected from one or more of the following:

cyclooctadienepalladium(II) dihalide where "halide" represents "chloride", "bromide", "iodide" or "fluoride";

a π-lower alkenyl-acetylacetonato-metal(II) compound in which the alkenyl group is an allyl group and an alkyl group having 1 to 10 carbon atoms optionally is bonded to the allyl group, and preferably in which the metal is palladium or platinum;

a π-lower alkenyl-dibenzoylmethyl-metal(II) compound in which the alkenyl group is an allyl group and an alkyl group having 1 to 10 carbon atoms is optionally bonded to the allyl group, and preferably in which the metal is palladium or platinum;

a bis(π-lower alkenyl-halo-metal(II)) compound in which the alkenyl group is an allyl group and an alkyl group having 1 to 10 carbon atoms is optionally bonded to the allyl group and preferably in which the metal is palladium or platinum, and in which "halo-" represents "bromo-", "chloro-", "iodo-" or "fluoro-";

a cyclooctadieneplatinum(II) dihalide where "halide" represents "chloride", "bromide", iodide" or "fluoride";

More preferably, the surface activation compound may be selected from one or more of the following:

π methallyl-acetylacetonato-palladium(II);

π methallyl-dibenzoylmethyl-palladium(II);

bis(π methallyl-chloro-palladium(II));

π-methallyl-acetylacetonato-platinum(II);

π-methallyl-dibenzoylmethyl-platinum(II);

bis(π-methallyl-chloro-platinum(II)).

By lower alkenyl group is meant a hydrocarbyl group with one or more olefinic double bonds and having from 2 to 10 carbon atoms in a straight or branched chain. Examples of such groups are allyl, methallyl, isopentenyl, dimethylallyl, butenyl and triallyl methyl groups.

The alkyl groups may have up to 10, preferably 1 to 6, carbon atoms in a straight or branched chain and may be substituted by a hydroxyl, lower alkoxy or di-lower alkyl amino group. Lower means $C_1$–$C_6$ and examples of lower alkyl groups are methyl, ethyl, isopropyl, sec.butyl, neo-pentyl, tert.butyl, n-hexyl, or substituted alkyl group such as hydroxyethyl or diethylaminoethyl groups. Preferably the substituent is a methyl or ethyl group.

Suitable compounds for use in the invention include those of formulae:

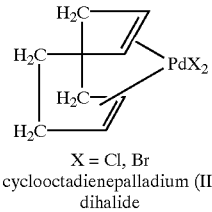

X = Cl, Br
cyclooctadienepalladium (II) dihalide

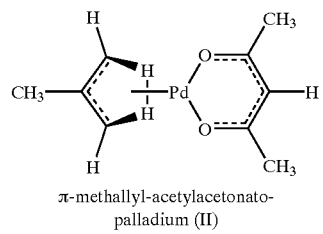

π-methallyl-acetylacetonato-palladium (II)

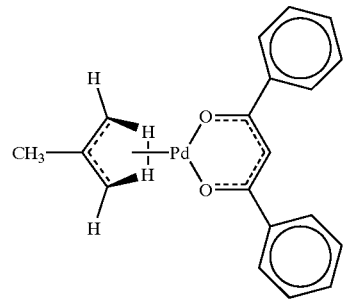

π-methallyl-dibenzoylmethyl-palladium (II)

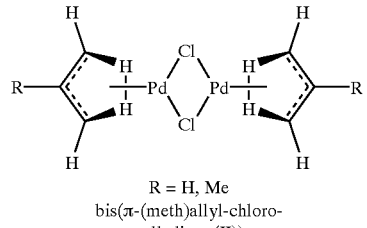

R = H, Me
bis(π-(meth)allyl-chloro-palladium (II))

The metal to be deposited by the electroless plating may be selected from copper, nickel or gold, or any other suitable metal.

The surface activation process may be conducted at atmospheric pressure.

The method may be used for the deposition of discrete pads of metal onto a substrate (metal bumping). This process involves in one example the activation of the substrate with pads or specific layers of palladium and the subsequent deposition of nickel, or other suitable metals, on the discrete pads which may form a basis for subsequent soldering activities.

The invention also provides a method of producing metallised substrates by activating the substrate surface, coating with a metal by electroless plating and, if or as required, thickening the thin layer, on which the activation is carried out by a method as described above.

The invention also provides metallised articles, dielectrics and printed circuits produced using the method(s) described above.

In a particularly preferred method the surface activation compound is an organometallic compound such that the metal is palladium or platinum, irradiation is carried out using an excimer lamp with emission wavelengths in the range 215 nm to 260 nm and a peak emission wavelength of 222 nm, and the metal subsequently deposited by electroless plating is copper or nickel.

Preferably the organometallic compound is π-methallyl-acetylacetonato-palladium(II) or is π-methallyl-dibenzoylmethyl-palladium(II), or another organopalladium or organoplatinium compound which has a ligand-to-metal charge transfer optical absorption band peak at a wavelength which is within 5 nm above or below 222 nm.

The invention also provides for the use of a metal complex having at least one ligand bonded thereto to activate a substrate for subsequent deposition of metal comprising the steps of:

depositing the metal complex on substrate to be activated, and exposing the metal complex to ultraviolet radiation of suitable wavelength to weaken the metal ligand bond, initiating the decomposition of the metal complex to the metal.

This decomposition of the complex is optionally assisted by the application of heat.

The irradiation of the compound is preferably performed at a temperature which is below the temperature at which the activation compound coating starts to thermally decompose in the dark, but is above the temperature at which it will decompose in the presence of UV radiation at part or all of the wavelength range 210–260 nm or 290–330 nm.

The advantage of this preferred method is that the use of a vacuum during irradiation can be avoided and that the photoactivity under the 222 nm KrCl* excimer lamp irradiation is efficient enough to allow a short exposure time (several minutes) at a low temperature (preferably under 100° C.) with a monolithic metal-coated quartz or fused silica mask in contact with the coating.

In another preferred method, the organometallic compound is cyclooctadienepalladium(II) dichloro or cyclooctadienepalladium(II) dibromide or cyclooctadienepalladium(II) diodide or cyclooctadienepalladium(II) difluoride.

In another preferred method, the organometallic compound is bis(π-methallyl-chloro-palladium(II)).

The surface activation compound may be a combination of two or more suitable organometallic compounds.

The method of the current invention may be used in the preparation and manufacture of integrated circuits.

The advantages of the method of the present invention are that:

The photoactivity of the photochemicals is chosen to match the available emission band of the excimer source;

No vacuum is required;

The mask used for selective radiation in the invention may be a transparent monolithic substrate partially coated with an opaque coating which may be metal in the pattern of the sites which are not to be exposed to ultraviolet radiation and which may be in contact with the coating on the substrate. The invention may therefore be performed in a conventional contact mask aligning and ultraviolet exposure apparatus equipped with a suitable excimer lamp source, with a monolithic aperture-free mask of the type commonly used in photolithography processes, consisting of a transmitting plate of quartz or fused silica with a selective metal coating at the sites on the coating which are not to be exposed to ultraviolet radiation; Stuke et al, in the U.S. Pat. No. 4,900,581 referred to, specifically depict a metal mask with holes in it, as opposed to a transparent substrate mask having a coating which is transparent at certain sites which are to be activated and where metal is to be deposited.

It is believed that in the prior art the metal salt only exhibited decomposition at a high rate when exposed to a low pressure gas in the chamber containing the excimer lamp, in which a plasma has been shown to be present. The work of Esrom et al in Chemtronics 4 (1989) pages 202–208 "VUV light-induced deposition of palladium using an incoherent $Xe_2$* excimer source" reports such a pressure dependent enhancement of the decomposition reaction rate of palladium acetate when the pressure is reduced to 1 torr. It has been most unexpectedly discovered by the inventors that this enhancement of the decomposition reaction rate of palladium acetate is lost when the chamber pressure is reduced below $10^{-3}$ torr. In contrast the invention works on the basis that the film is sufficiently photoactive to exhibit decomposition at a high rate, at atmospheric pressure, and with a monolithic mask in contact with the coating.

The invention will now be described more particularly, by way of example only, with reference to the following specific Examples.

EXAMPLE 1

π-methallyl-acetylacetonato-palladium(II) was dissolved in tetrahydrofuran to produce a $2.0 \times 10^{-2}$ M solution. A substrate consisting of an alumina ($Al_2O_3$) ceramic wafer (lateral dimensions 50×50 mm, thickness 1 mm, mean surface roughness 0.8 $\mu$m) was spin-coated with 100 $\mu$l of the resulting solution at a spin speed of 1200 r.p.m. The alumina substrate was removed from the solution and allowed to dry in air for 5 minutes. This coating of the substrate took place in a laboratory in which all wavelengths of visible light and natural low intensity ambient ultraviolet light at wavelengths above 300 nm was present. A chromium coated high purity fused silica mask in which the opaque chromium coating was removed at the sites where it was required that the mask transmit the radiation from a source consisting of three excimer lamps placed adjacent to one another was placed over the coated substrate, which was then irradiated through the mask with light from the silent discharge excimer lamps, each having a quartz envelope and filled with argon gas, which emitted electromagnetic radiation in a wavelength band centred on an intensity peak at wavelength 222 nm and with over 90% of its peak intensity being in the wavelength range 215 nm to 230 nm. The quartz envelope of the lamps and the fused silica substrate of the mask transmits all of this radiation. The mask was placed directly above and in contact with the coating on the substrate and the lamp envelope was placed directly above the mask. Ultraviolet irradiation took place for 5 minutes at an intensity of 40 mW.cm$^{-2}$ and at a substrate temperature which was initially at the ambient room temperature of 25° C. and rose under irradiation to 80° C. after 10 minutes exposure. After irradiation, the selectively irradiated coated sample was allowed to cool to approximately room temperature (below 35° C.), was rinsed in a flow of tetrahydrofuran for 3 minutes, and was then placed in an Alfachimici Cupro Thick 84 copper electroless plating solution for 15 minutes, after which the substrate was withdrawn and rinsed under flowing de-ionised water to remove the residual electroless solution. A coherent copper film was formed at those sites where the coating had been irradiated and no copper was found at the sites where the coating had not been irradiated. Tests on a pad of continuous copper formed on the alumina substrate by the above method showed it to have an electrical resistivity, measured by the four-point probe method, of 2.5 $\mu\Omega$.cm and an adhesion to the substrate, measured by destructive pull testing, of greater than $1.0 \times 10^5$ kg.m$^{-2}$.

The compound forms a dispersed solid granular coating with multiple grains deposited in any region of the substrate surface which is 10 square microns in area.

It will be noted that no vacuum was used in this process, and that the temperature did not exceed 90° C., and that the compound π-methallyl-acetylacetonato-palladium(II) has been demonstrated by thermogravimetric analysis and differential scanning calorimetry to be thermally stable in the solid state at atmospheric pressure at a temperature of 90° C.

It will be noted that the compound π-methallyl-acetylacetonato-palladium(II) does not contain any halides, nor does the solvent used. This provides advantages for certain applications, including the production of halide-ion-free metallisations required for certain purposes where it is proposed to attach a conductive pin or wire by a soldering process.

EXAMPLE 2

An alumina substrate was treated as in Example 1, except that the compound, dissolved in tetrahydrofuran to make the solution from which the coating was formed, was π-methallyl-dibenzoylmethyl-palladium(II) and the time for the selective sheet-wise irradiation of the coating was 20 minutes.

It will be noted that no vacuum was used in this process, and that the temperature did not exceed 90° C., and that the compound π-methallyl-dibenzoylmethyl-palladium(II) has been demonstrated by thermogravimetric analysis and differential scanning calorimetry to be thermally stable in the solid state at atmospheric pressure at a temperature of 90° C.

It will be noted that the compound π-methallyl-dibenzoylmethyl-palladium(II) does not contain any halides, nor does the solvent used. This provides advantages for certain applications, including the production of halide-ion-free metallisations required for certain purposes where it is proposed to attach a conductive pin or wire by a soldering process

EXAMPLE 3

An alumina substrate was treated as in Example 2, except that the time for the selective sheet-wise irradiation of the coating was 10 minutes and the temperature during exposure reached 120° C.

The advantages of the present invention lie in the following characteristics:
- the use of an organometallic compound rather than a metal salt for the coating from which the activation layer is produced, characterised in that, in the solid state:
  - the organometallic compound has one or more functional groups which in the solid state are photolabile on exposure to ultraviolet radiation of sufficient intensity of wavelength(s) at which the compound absorbs light strongly, at temperatures below the thermal decomposition temperature, characterised in that the optical absorption peak associated with the transfer of charge from the ligand to the metal is within 5 nm of the peak emission wavelength of a practically available excimer lamp;
- the compound decomposes to the metal present within it when exposed to ultraviolet radiation of the above-mentioned wavelength(s) at a temperature which is lower than the temperature at which thermal decomposition begins to occur in the absence of ultraviolet radiation, and at atmospheric pressure, and with a transmitting plate in contact with the coating of the compound;
- the compound forms a dispersed solid granular coating with multiple grains deposited in any region of the substrate surface typically over part of the surface which is 10 square microns in area;
- the close matching of the optimum wavelength for ultraviolet radiation exposure of the compound in the solid state to the narrow emission wavelength bands of the practically available excimer lamps whose emissions are air-transmissible (i.e. the inert gas chloride excimer lamps with quartz or silica envelopes, emitting in the approximate wavelength ranges of either 215 nm to 260 nm or 290 nm to 330 nm);
- the ability to perform the invention in a conventional contact mask aligning and ultraviolet exposure apparatus equipped with a suitable excimer lamp source, and ability to use a monolithic aperture-free mask of the type commonly used in photolithography processes, consisting of a transmitting plate of quartz or fused silica with a selective metal coating at the sites on the coating which are not to be exposed to ultraviolet radiation, in contact with the coating in order to obtain the selective activation layer pattern;
- the genuinely photolytic and plasma-free nature of the exposure step of the invention with a maximum reaction rate obtainable at atmospheric pressure, obviating the need for vacuum;
- the understanding that, using many organometallics, a minimum temperature above typical room temperature but below the decomposition temperature of the compound is required for a genuinely selective photolytic decomposition of the compound to a selective activation layer.

What is claimed is:

1. A method of surface activating a substrate prior to an electroless plating of the substrate comprising:

A. forming a deposit or coating of a surface activation compound on the substrate, which surface activation compound has the property of activating a surface for electroless plating of a desired conducting material and contains a photolabile group as a ligand to a metal, wherein the metal is π-bonded to a substituted lower alkenyl group in the ligand, the lower alkenyl group having one or more olefinic double bonds and having from 2 to 10 carbon atoms in a straight or branched chain or a carbocycle, B. irradiating the surface compound in the absence of solvent with an excimer lamp emitting ultraviolet radiation in the wavelength range which overlaps with an optical absorption band arising due to the ligand to metal photolabile group to decompose the compound to produce directly a surface activation metal;

wherein
   the surface activation compound is selected from the group consisting of
   a π-lower alkenyl-acetylacetonato metal (II) compound, a π-lower alkenyl dibenzoylmethyl-metal (II) compound, a bis (π-lower alkenyl-halo-metal (II)) compound, in which "halo" represents bromo, chloro, iodo or fluoro, and cyclooctadiene metal (II) dihalide where "halide" represents chloride, bromide, iodide or fluoride.

2. The method in accordance with claim 1 wherein the step of irradiating the surface activation compound further comprises transmitting the radiation through a gas and through a mask which is patterned such as to mask the surface activation compound from exposure to the ultraviolet radiation at the sites which are not to be activated, and wherein the mask further has an opaque coating, which is on the side which is in contact with the substrate.

3. A method as claimed in claim 1 wherein the surface activation compound is applied to the substrate in the form of a liquid, a solution of the solid surface activation compound being prepared if required.

4. The method in accordance with claim 1 wherein the surface activation compound has the property of absorbing ultraviolet radiation in the wavelength range 210–260 nm.

5. A method as claimed in claim 2 wherein the gas is selected from air, nitrogen or an inert gas such as helium, argon, krypton or xenon.

6. A method as claimed in claim 2 wherein the mask is quartz, silica or other plate which is transparent to ultraviolet radiation in the wavelength range used for irradiating the surface active compound.

7. A method as claimed in claim 1 wherein the lower alkenyl group is substituted by an alkyl group having 1 to 10 carbon atoms.

8. A method as claimed in claim 1 wherein the metal is selected from palladium and platinum.

9. A method as claimed in claim 1 wherein the surface activation compound is selected from the group consisting of:

π methallyl-acetylacetonato-palladium (II);

π-methallyl-dibenzoylmethyl-palladium (II);

bis (π methallyl-chloro-palladium (II));

π methallyl-acetylacetonato-platinum (II);

π methallyl-dibenzoylmethyl-platinum (II);

bis (π-methallyl-chloro-platinum (II)).

10. A method according to claim 1 wherein the surface activation compound possesses an optical absorption band arising due to ligand-to-metal charge transfer, such that said optical absorption band overlaps closely to the optical emission band of the ultraviolet lamp used for irradiating the surface active compound.

11. A method according to claim 2 wherein the mask is at least 2 millimeters thickness.

12. A method according to claim 1 carried out at about atmospheric pressure.

13. A method for the deposition of discrete pads of metal onto a substrate, in which the activation of the substrate is carried out by a method as claimed in claim 1.

14. A method for producing metallised substrates by activating the substrate surface, coating with a metal by electroless plating and, as required, thickening the metal layer, in which the activation of the substrate is carried out by a method as claimed in claim 1.

15. A method as claimed in claim 1 wherein the compound has the property of absorbing ultraviolet radiation in the wavelength range 290–330 nm.

16. A method as claimed in claim 7 wherein the alkyl group is substituted by a group selected from one of hydroxyl, $C_1$–$C_6$ alkoxy or di-($C_1$–$C_6$ alkyl) amino group.

17. A method of activating a substrate for a subsequent electroless plating of the substrate comprising the steps of:

(a) depositing, on the substrate to be activated, an organometallic compound having at least one photolabile group as a ligand to a metal, the metal and the ligand being bonded by a metal-carbon bond, wherein the metal is π-bonded to a substituted lower alkenyl group in the ligand, the lower alkenyl group having one or more olefinic double bonds and having from 2 to 10 carbon atoms in a straight or branched chain or a carbocycle, (b) exposing the organometallic compound in the absence of the solvent to ultraviolet radiation of suitable wavelength to weaken the metal-carbon bond between the metal and the ligand, initiating the photodecomposition of the organometallic compound to the metal, wherein
the organometallic compound is selected from the group consisting of
a π-lower alkenyl-acetylacetonato metal (II) compound,
a π-lower alkenyl dibenzoylmethyl-metal (II) compound,
a bis (π-lower alkenyl-halo-metal (II)) compound, in which "halo" represents bromo, chloro, iodo or fluoro, and
cyclooctadiene metal (II) dihalide where "halide" represents chloride, bromide, iodide or fluoride.

18. The method in accordance with claim 17 further comprising the step of heating the substrate.

19. A method of preparing a substrate for electroless plating comprising the steps of:

A. forming a deposit or coating of a surface activation compound on the substrate, the surface activation compound being a compound which contains a photolabile group as a ligand to a metal, and wherein the compound has the property of being photochemically active such that it decomposes to the metal when exposed to ultraviolet radiation of a wavelength which overlaps with an optical absorption band arising due to the ligand-to-metal photolabile group at a temperature at which said compound does not decompose in the absence of ultraviolet radiation, and has the property of activating a surface for electroless plating of the desired conducting material, and wherein the metal is π-bonded to a substituted lower alkenyl group in the ligand, the lower alkenyl group having one or more olefinic double bonds and having from 2 to 10 carbon atoms in a straight or branched chain or a carbocycle;

B. irradiating the surface compound in the absence of solvent with ultraviolet radiation to produce a surface activation, wherein
the surface activation compound is selected from the group consisting of
a π-lower alkenyl-acetylacetonato metal (II) compound,
a π-lower alkenyl dibenzoylmethyl-metal (II) compound,
a bis (π-lower alkenyl-halo-metal (II)) compound, in which "halo" represents bromo, chloro, iodo or fluoro, and
cyclooctadiene metal (II) dihalide where "halide" represents chloride, bromide, iodide or fluoride.

20. A method of electroless plating a substrate comprising the steps of:

(a) preparing the substrate for electroless plating in accordance with claim 1 or 19, and (b) electroless plating the prepared substrate.

* * * * *

UNITED STATES PATENT AND TRADEMARK OFFICE
CERTIFICATE OF CORRECTION

PATENT NO.    : 6,524,663 B1
DATED         : February 25, 2003
INVENTOR(S)   : Patrick V. Kelly et al.

It is certified that error appears in the above-identified patent and that said Letters Patent is hereby corrected as shown below:

<u>Title page, Item [54] and Column 1, line 2,</u>
Title, change "METALLIZATION" to -- METALLISATION --

Signed and Sealed this

Ninth Day of September, 2003

JAMES E. ROGAN
*Director of the United States Patent and Trademark Office*